US011415600B2

(12) United States Patent
Vettori

(10) Patent No.: US 11,415,600 B2
(45) Date of Patent: Aug. 16, 2022

(54) PROBE CARD FOR HIGH FREQUENCY APPLICATIONS

(71) Applicant: Technoprobe S.p.A., Cernusco Lombardone (IT)

(72) Inventor: Riccardo Vettori, Cernusco Lombardone (IT)

(73) Assignee: Technoprobe S.p.A., Cernusco Lombardone (IT)

(*) Notice: Subject to any disclaimer, the term of this patent is extended or adjusted under 35 U.S.C. 154(b) by 0 days.

(21) Appl. No.: 17/139,782

(22) Filed: Dec. 31, 2020

(65) Prior Publication Data

US 2021/0123950 A1 Apr. 29, 2021

Related U.S. Application Data

(63) Continuation-in-part of application No. PCT/EP2019/067669, filed on Jul. 2, 2019.

(30) Foreign Application Priority Data

Jul. 4, 2018 (IT) .................. 102018000006903

(51) Int. Cl.
G01R 1/073 (2006.01)
G01R 1/067 (2006.01)

(52) U.S. Cl.
CPC ....... G01R 1/0735 (2013.01); G01R 1/06772 (2013.01)

(58) Field of Classification Search
CPC .................. G01R 1/0735; G01R 1/06772
See application file for complete search history.

(56) References Cited

U.S. PATENT DOCUMENTS

| 8,202,684 B2* | 6/2012 | Hamada | G01R 3/00 |
| | | | 430/315 |
| 2004/0036493 A1 | 2/2004 | Miller | |
| 2008/0061808 A1 | 3/2008 | Mok et al. | |
| 2009/0042323 A1 | 2/2009 | Kasukabe et al. | |
| 2010/0105224 A1 | 4/2010 | Narita et al. | |
| 2013/0328585 A1 | 12/2013 | Onuma et al. | |

* cited by examiner

Primary Examiner — Paresh Patel
(74) Attorney, Agent, or Firm — Seed Intellectual Property Law Group LLP

(57) ABSTRACT

A probe card for testing a device under test having a plurality of contact pads includes a support plate having first contact pads thereon. A flexible membrane has a first face and a peripheral portion including second contact pads thereon. A plurality of contact probes are associated with a first face of the flexible membrane and are configured to abut onto the plurality of contact pads of the device under test. A sliding contact area includes: the first contact pads formed on the support plate; the second contact pads formed on the peripheral portion of the flexible membrane, the peripheral portion of the flexible membrane configured to come in pressing contact onto the support plate at the sliding contact area. A pressing element contacts the peripheral portion of the flexible membrane at the sliding contact area, and the pressing element puts the second contact pads into pressing contact with the first contact pads.

30 Claims, 11 Drawing Sheets

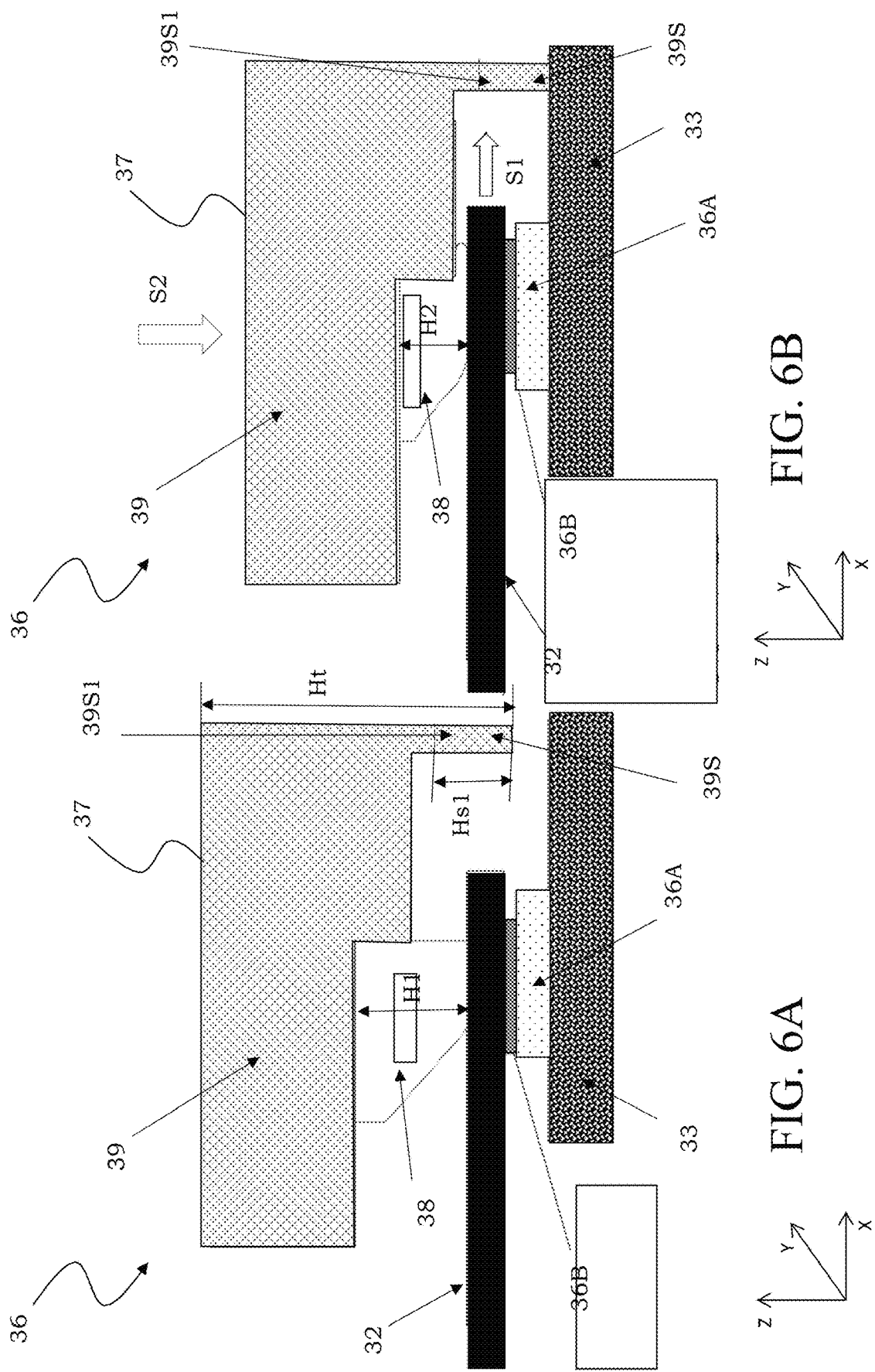

PROBE CARD FOR HIGH FREQUENCY APPLICATIONS

BACKGROUND

Technical Field

The present disclosure relates to a probe card for testing electronic devices integrated on a semiconductor wafer.

More particularly, the present disclosure relates to a probe card comprising at least one support plate for the connection to the testing apparatus as well as a flexible membrane and a plurality of contact probes associated with a first face thereof, these contact probes being configured to abut onto a plurality of contact pads of a device under test integrated on a semiconductor wafer and being configured to carry high frequency signals.

The following description is made with reference to this field of application with the only purpose of simplifying the exposition thereof.

Description of the Related Art

As it is well known, a probe card is essentially a device configured to electrically connect a plurality of contact pads of a microstructure, in particular an electronic device integrated on a semiconductor wafer, with corresponding channels of a testing apparatus which performs the functionality testing thereof, particularly the electrical one, or generically the test.

The test performed on integrated circuits serves in particular to detect and isolate defective circuits as early as in the production phase. Usually, the probe cards are thus used for the electric test of the integrated circuits on wafers before cutting and assembling them inside a chip containment package.

A probe card comprises a probe head, in turn essentially including a plurality of movable contact probes retained by at least one support, generally a pair of supports or guides which are substantially plate-like and parallel to each other. These plate-like supports are equipped with suitable holes and are located at a distance from each other so as to leave a free area or air gap for the movement and the possible deformation of the contact probes, which are normally formed by wires of special alloys with good electrical and mechanical properties.

In particular, a probe card 15 is schematically shown in FIG. 1, including a probe head 1 in turn comprising at least one upper plate-like support or guide 2, usually also indicated as "upper die," and a lower plate-like support or guide 3, usually also indicated as "lower die," having respective guide holes 4 and 5 through which a plurality of contact probes 6 slide.

Each contact probe 6 ends at an end with a contact tip 7 intended to abut onto a contact pad 8 of a device under test integrated on a wafer 9, so as to mechanically and electrically contacting this device under test and a testing apparatus (not depicted) which this probe card 15 forms an end element of.

As indicated in FIG. 1, the upper guide 2 and the lower guide 3 are suitably spaced by an air gap 10 which allows the deformation of the contact probes 6.

The good connection between the contact probes 6 and the contact pads 8 of the device under test is ensured by pressing the probe head 1 on the device itself, the contact probes 6, which are movable through the guide holes formed in the guide, undergoing, during this pressing contact, a bending inside the air gap 10 and a sliding inside these guide holes. Probe heads of this type are commonly called vertical probe heads.

In some cases, the contact probes are fixedly fastened to the head itself at the upper plate-like support or guide: in this case they are referred to as blocked probe heads.

However, probe heads with probes that are not fixedly blocked, but held interfaced to a so-called board, possibly through a micro-contact board are more frequently used: they are referred to as unblocked probe heads. The micro-contact board is usually called "space transformer" since, besides contacting the probes, it also allows the contact pads formed thereon to be spatially redistributed, with respect to the contact pads on the device under test, relaxing in particular the distance constraints between the centers of the pads themselves.

In this case, still referring to the example shown in FIG. 1, each contact probe 6 has a further end area or region which ends with a so-called contact head 11 towards a contact pad 12 of a plurality of contact pads of a space transformer 13 of the probe card 15 comprising the probe head 1. The good electrical contact between the contact probes 6 and the space transformer 13 is ensured by the pressing abutment of the contact heads 11 of the contact probes 6 onto the contact pads 12 of this space transformer 13, similarly to the contact between the contact tips 7 with the contact pads 8 of the device under test integrated on the wafer 9.

Furthermore, the probe card 15 comprises a support plate 14, generally a printed circuit board (PCB), connected to the space transformer 13, through which the probe card 15 interfaces with the testing apparatus.

The correct working of a probe card is basically linked to two parameters: the vertical movement, or overtravel, of the contact probes and the horizontal movement, or scrub, of the contact tips of these contact probes on the contact pads of the device under test. It is notoriously important to ensure the scrub of the contact tips so as to allow these contact pads to be scraped on the surface removing the impurities, for example, in the form of a thin oxide layer or film, thereby improving the contact made by the probe card.

All these features are to be evaluated and calibrated in the manufacturing step of a probe card, since the good electrical connection between the probes and the device under test should always be ensured.

It is likewise important to ensure that the pressing contact of the contact tips of the probes onto the contact pads of the device is not so high as to cause the breaking of the probe or of the pad itself.

This problem is particularly felt in the case of the so-called short probes, i.e., probes with a limited-length body, in particular with a size of less than 5000 µm. Probes of this type are used, for example, for high frequency applications, the reduced length of the probes limiting the related self-inductance phenomenon. In particular, it is pointed out that the term "probes for high frequency applications" means probes configured to carry signals with frequencies of more than 1 GHz.

The recent need to manufacture probe cards configured to carry signals at higher and higher frequencies, up to radiofrequencies, is in fact well known, with a subsequent drastic reduction of the length of the contact probes to allow these signals to be carried without adding noise, for example, due to the above-mentioned self-inductance phenomenon.

However, the reduced length of the body of the probes dramatically increases the stiffness of the probe itself, which involves an increase of the force exerted by the respective contact tip on the contact pads of a device under test, which can lead to a breaking of these pads, with irreparable damage of the device under test, a situation to be obviously avoided. Even more dangerously, the increase in the stiffness of the contact probe due to the reduction of the length of the body thereof also increases the risk of breaking the probes themselves.

To remedy to these problems some solutions are known, in which the probe card comprises a flexible membrane with which a plurality of reduced-length contact probes or microprobes are associated, configured to provide the mechanical and electrical contact with the contact pads of the device under test, as well as at least one damping structure associated with the membrane at these contact probes.

A known solution of this type is schematically shown in FIG. 2A.

In particular, this figure illustrates a probe card 20 comprising at least one damping structure 21 interposed between a flexible membrane 22 and a support plate 23, which in some embodiments is a printed circuit board (PCB) which ensures the connection between this probe card 20 and the testing apparatus (not shown).

Suitably, the flexible membrane 22 comprises a first portion or central portion 22A, a second portion or intermediate portion 22B and a third portion or peripheral portion 22C. More particularly, as it will be clarified below, the central portion 22A is intended to contact the damping structure 21 and the peripheral portion 22C is intended to contact the support plate 23, while the intermediate portion 22B is a portion intended to deform, in particular to lengthen and shorten, following the movement of the device under test integrated on the semiconductor wafer 24 in contact with the central portion 22A during the testing operations thereof.

The probe card 20 further comprises a plurality of contact microprobes 25 arranged on a first face F1 of the flexible membrane 22, formed in particular at the central portion 22A thereof, this first face F1 being a lower face of the flexible membrane 22 according to the local reference of FIG. 2A.

The contact microprobes 25 are configured to contact the contact pads 24A of a device under test integrated on a semiconductor wafer 24 and they are made of a conductive material selected, for example, between platinum, rhodium, palladium, silver, copper or an alloy thereof, such as a platinum alloy.

Suitably, in particular in the case of high frequency applications, the contact microprobes 25 have a reduced height, for example, a height of less than at least 200 µm, comprised in general between 10 µm and 200 µm, height meaning a dimension of these probes measured in a direction which is orthogonal to the device under test, that is along the axis Z of the local reference system indicated in the figure. In the solutions known on the market, these microprobes 25 are formed as pyramids directly grown on the flexible membrane 22 through photolithographic processes.

Furthermore, the damping structure 21, positioned at the central portion 22A of this flexible membrane 22, that is at the portion equipped with the contact microprobes 25 and thus corresponding to an area of the wafer 24 comprising the contact pads 24A of the device under test integrated thereon, abuts onto a second face F2 of the flexible membrane 22, opposed to the first face F1. Thereby, the damping structure 21 forms an abutting element for the flexible membrane 22 in this central portion 22A and allows it to be retained in the direction of the axis Z during the pressing contact of the contact microprobes 25 onto the contact pads 24A of the device under test integrated on the semiconductor wafer 24.

This damping structure 21 also acts as a damping element for the contact microprobes 25, regulating the contact force thereof on the contact pads 24A of the device under test integrated on the semiconductor wafer 24. Suitably, the damping structure 21 can be also made of materials configured to maximize the damping effect for the contact microprobes 25 and to ensure a flatness of the central portion 22A of the membrane 22 during the contact with the device under test integrated on the semiconductor wafer 24.

The flexible membrane 22 further comprises conductive tracks configured to carry signals from the contact microprobes 25 towards the support plate 23 and suitably connected thereto. The conductive tracks can be formed on a surface of the membrane 22, in particular the second face F2 or upper face thereof according to the local reference of the figure or inside the membrane itself and they extend from the central portion 22A of this flexible membrane 22, at a corresponding contact microprobe 25 to which they are connected, along the intermediate portion 22B of this flexible membrane 22, so as to be connected to the support plate 23 at the peripheral portion 22C of the membrane 22.

More particularly, as shown in the example of FIG. 2A, the membrane 22 is connected to the support plate 23 by a weld 26, made at the peripheral portion thereof 22C. This weld 26 is suitably made at a contact area of the support plate 23, for example, a pad or contact pad formed thereon.

Thereby, the weld 26 provides the mechanical and electrical contact between the membrane 22, in particular of the conductive tracks thereof, and the support plate 23, in particular the contact pads thereof. Thereby, the conductive tracks, which are flexible as well, perform the desired redirection of the signals from the contact microprobes 25 towards the pads of the support plate 23. More particularly, in known solutions, the conductive tracks connect the contact microprobes 25 formed on the first face F1 of the flexible membrane 22 with the contact pads of the support plate 23 facing at the second face F2 of the flexible membrane 22 itself due to suitable vias formed therein to allow the passage of these conductive tracks. Alternatively, the support plate 23 is equipped with appropriate openings for the passage of the flexible membrane 22 so as to allow the conductive tracks formed on the first face F1 thereof to come in contact with contact pads of the support plate 23 formed at a face thereof which is opposed to the face F, in particular an upper face of the support plate 23.

It is also possible to use a film of conductive glue or rubber or real screws to connect the membrane 22 and the support plate 23.

It is nevertheless well known that these contacts made by welds, conductive glues or rubbers, screws actually cause of serious troubles when carrying high frequency signals, such as radiofrequency signals, actually providing probe cards as a whole not very performing.

Some known solutions also provide for equipping the flexible membrane 22 at the contact with the support plate 23 with local conductive microprojections, for example, micropyramids grown on the membrane itself through lithographic processes, these microprojections being in contact with the conductive tracks and configured to locally penetrate into the contact pads of the support plate 23 when the flexible membrane 22 is pressed onto the support plate 23, for example, due to the use of suitably positioned screws, providing the desired mechanical and electrical contact therebetween.

It is also possible, as schematically shown in FIG. 2B, by forming suitable vias 27A within the support plate 23, to directly connect the flexible membrane 22 with the testing apparatus (not shown), in particular by appropriate radiofrequency connection means 27, such as, for example, coaxial cables or SMA connectors, issued from the testing apparatus. Suitably, corresponding openings for housing these radiofrequency connection means 27 can be formed in the membrane 22, in particular at the peripheral portion 22C thereof. Thereby, conductive tracks in the membrane 22 can be directly connected to the testing apparatus by these radiofrequency connection means 27.

A probe card in which a flexible printed circuit (FPC) board is mounted on a main board by a clamp mechanism comprising a plurality of rings associate by means of fixing bolts screwed into corresponding bolt holes is known from the US patent publication No. US 2013/328585.

These known solutions, providing a fixed association between the membrane and the support plate or testing apparatus, have subsequent problems linked to the movement and to the deformation of the membrane itself during the testing operations when the probe card is in pressing contact with the semiconductor wafer.

In this case, in fact, the central portion 22A rises by virtue of the pressure of the device under test integrated on the semiconductor wafer 24, in particular by virtue of the contact between the contact microprobes 25 and the contact pads 24A of this device under test. The movement of the central portion 22A of the membrane involves the elastic deformation of the intermediate portion 22B with subsequent stresses, in particular shearing stresses, but also of the bending type at the peripheral portion thereof 22C where the contact with the support plate 23 or with the testing apparatus occurs.

These stresses existing at the peripheral portion 22C of the membrane 22 increase the risks of breaking it, possibly local micro-breakings.

In any case, the presence of these stresses and of the subsequent deformations and possible micro- or macro-breakings of the peripheral portion 22C of the membrane 22 worsens the quality of the carried signal, in particular a high frequency one.

BRIEF SUMMARY

The probe card is configured to carry high frequency signals without adding any noise to these signals, meanwhile ensuring a correct working thereof during the contact of the relevant contact probes with the pads of a device under test, removing the risk of breaking, deformation and/or movement of the membrane which these contact probes are associated with, in particular at a peripheral portion thereof providing a mechanical and electrical contact, so overcoming the problems tied to the prior art solutions.

According to an aspect of the disclosure, the probe card is equipped with an elastic pressing element configured to provide the desired mechanical contact between a membrane and a support plate contained therein, in turn equipped with suitable pads for the electrical contact with each other, meanwhile stretching the membrane along a longitudinal direction thereof so as to ensure the integrity thereof even in case of different repositioning operations of the same.

The probe card for a testing apparatus of electronic devices comprises at least one support plate, as well as a flexible membrane and a plurality of contact probes associated with a first face thereof, these contact probes being configured to abut onto a plurality of contact pads of a device under test integrated on a semiconductor wafer and being configured to carry high frequency signals, and at least one sliding contact area including in turn first contact pads made on the support plate and second contact pads made on the flexible membrane at a peripheral portion thereof configured to come in pressing contact onto the support plate at the sliding contact area as well as at least one pressing element in pressing contact onto the peripheral portion of the flexible membrane at this sliding contact area so as to put in pressing contact the second contact pads onto the first contact pads providing an electrical and mechanical contact between the flexible membrane and the support plate.

More particularly, the probe card according to the disclosure comprises the following additional and optional features, taken individually or in case in combination.

According to an aspect of the disclosure, the pressing element can comprise at least one flexible head configured to abut onto the peripheral portion of the flexible membrane at a first face thereof, this flexible head being configured to squeeze under tightening conditions of the pressing element and having at least one contact face arranged at the first contact pads made on the flexible membrane.

In particular, this pressing element can also comprise a supporting body, associated with the flexible head, this supporting body being equipped with at least one step for an abutment of the flexible head under tightening conditions.

Furthermore, this supporting body can comprise at least one projection which is configured to abut onto the support plate under tightening conditions of the pressing element and it is equipped with an opening at conductive tracks made on this support plate.

According to an aspect of the disclosure, the flexible head can be configured to squeeze in a direction which is orthogonal to a reference plane, substantially corresponding to a plane of the semiconductor wafer comprising at least one device under test.

In particular, this flexible head can be shaped so as to further comprise at least one inclined face with respect to a reference plane so as to stretch the flexible membrane in a longitudinal direction during this tightening.

The inclined face of the flexible head can form with the reference plane an angle with values comprised between 15° and 75°, and in some embodiments 45°.

According to another aspect of the disclosure, the flexible head can be made of a silicon rubber or of an elastomer.

Furthermore, according to an aspect of the disclosure, the pressing element can be associated with a guide fastened to the support plate acting as a counter-pressor for the pressing element.

The probe card can further comprise a tightening pin arranged between the guide and the supporting body.

Yet according to another aspect of the disclosure, the flexible membrane can further comprise at least one pair of wings formed projecting from a body portion thereof at the first contact pads and comprising respective housing slots of alignment pins to retain the flexible membrane, these housing slots having an elongated shape along the longitudinal direction so as to allow a movement of the alignment pins in an opposite direction with respect to this longitudinal direction.

Furthermore, according to an aspect of the disclosure, the flexible membrane can be made of dielectric materials, which in some embodiments may be polyamide and it can have a thickness comprised between 10 and 100 µm, and in some embodiments the thickness may be substantially equal to or equal to 50 µm.

Moreover, the contact probes can have a height of less than 200 μm.

According to another aspect of the disclosure, the support plate can be a printed circuit board configured to connect to the testing apparatus.

According to a further aspect of the disclosure, the flexible membrane can comprise conductive tracks extending from the central portion towards the peripheral portion at an intermediate portion of the flexible membrane, these conductive tracks connecting the contact probes to the contact pads of the sliding contact area.

These conductive tracks can be made at a first face of the flexible membrane and/or at a second and opposed face of the flexible membrane and/or they can be embedded in the flexible membrane possibly on several levels.

Furthermore, the flexible membrane can comprise conductive vias for the connection between the first and second face suited to the passage of the conductive tracks made on the flexible membrane.

According to another aspect of the disclosure, the support plate can be equipped with openings for the passage of the flexible membrane.

Finally, the contact probes can be T-shaped.

The features and advantages of the probe card according to the disclosure will be apparent from the following description of an embodiment thereof given by way of non-limiting example with reference to the attached drawings.

BRIEF DESCRIPTION OF THE SEVERAL VIEWS OF THE DRAWINGS

FIGS. 6A and 6B show on an enlarged scale and in a simplified form a detail of the probe cards of FIGS. 5A and 5B in different working conditions thereof;

DETAILED DESCRIPTION

Figure 1:
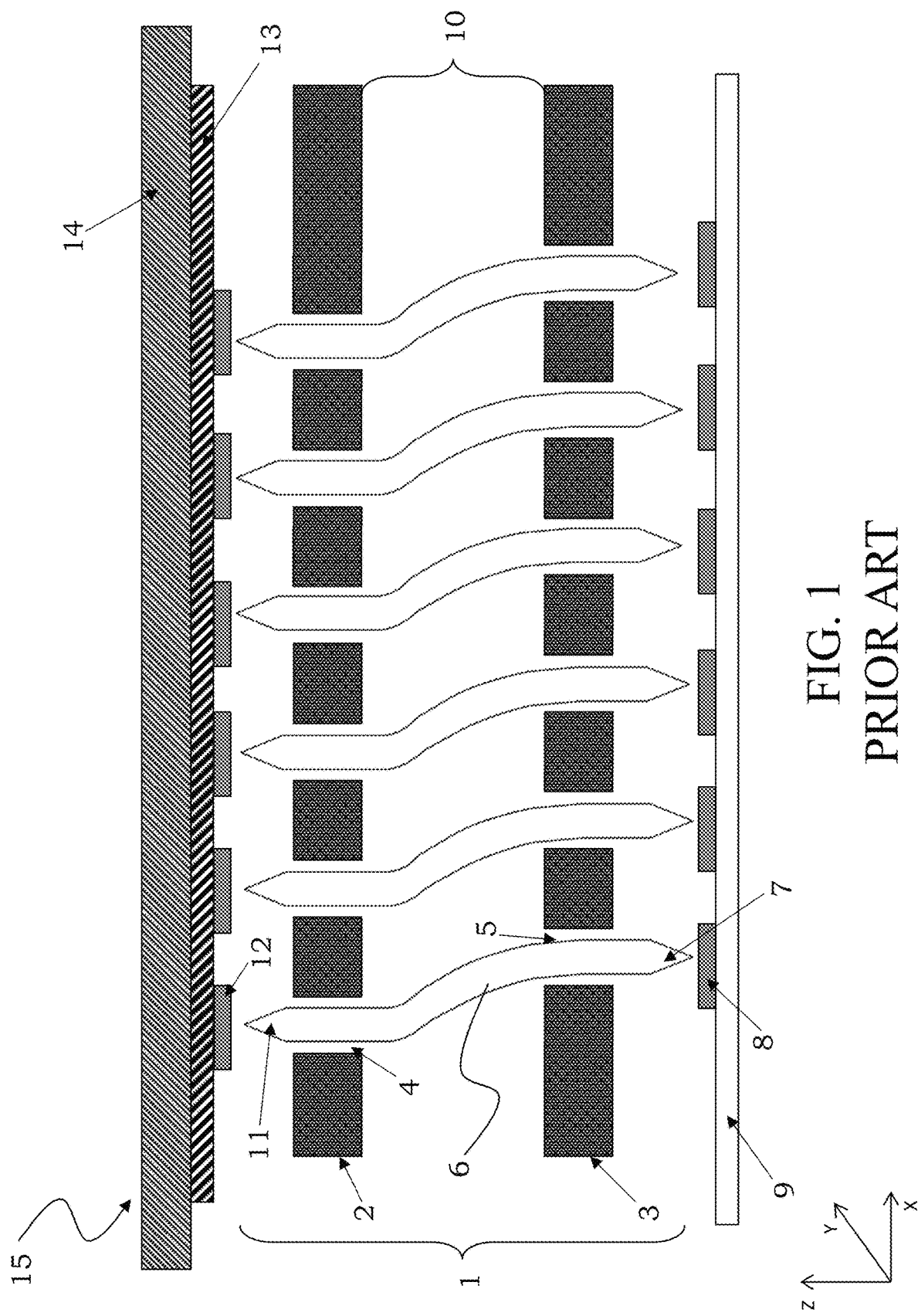
FIG. 1 schematically shows a probe card realized according to the prior art.
Figure 2A:
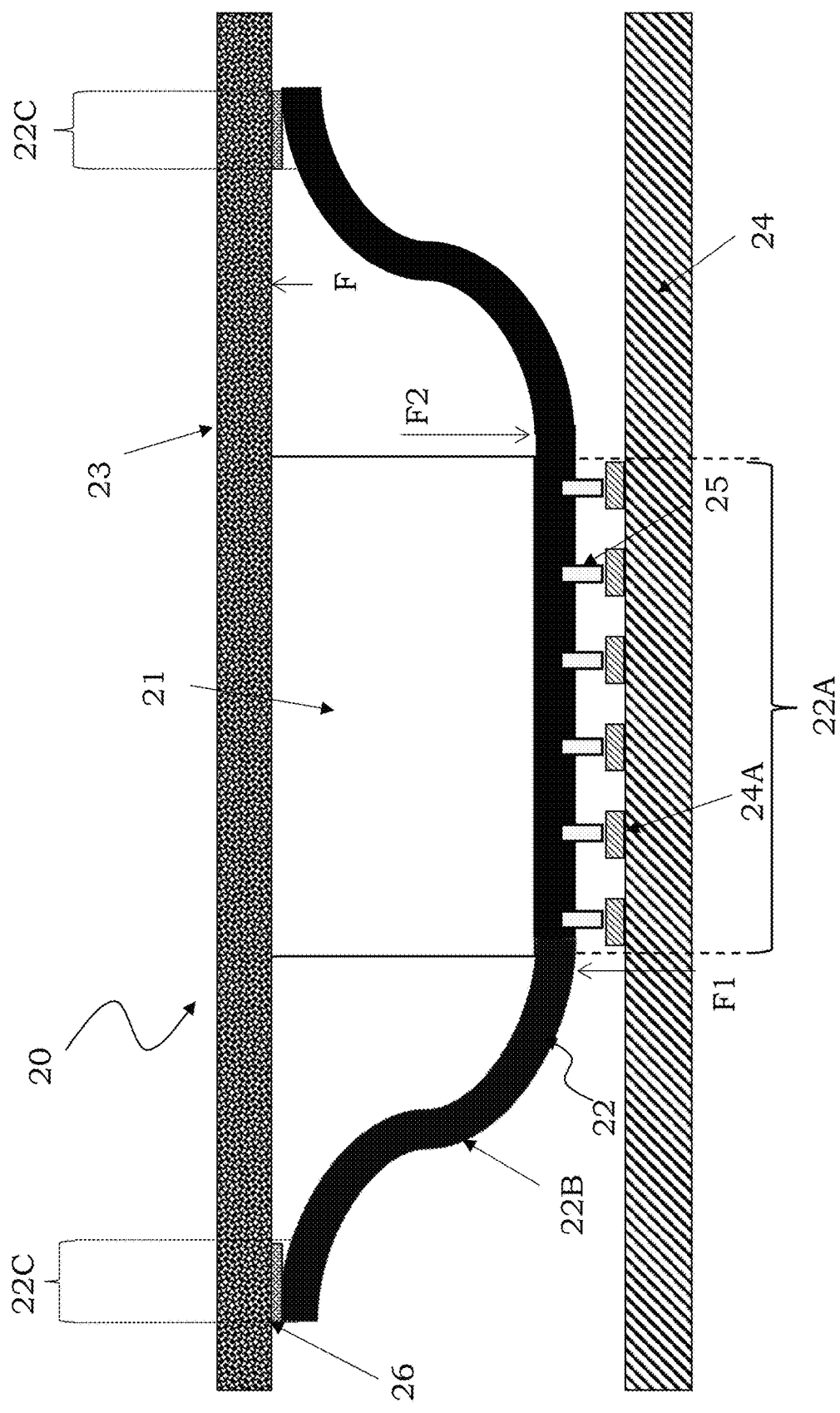
FIG. 2A schematically shows a probe card equipped with a membrane for high frequency applications realized according to the prior art.
Figure 2B:
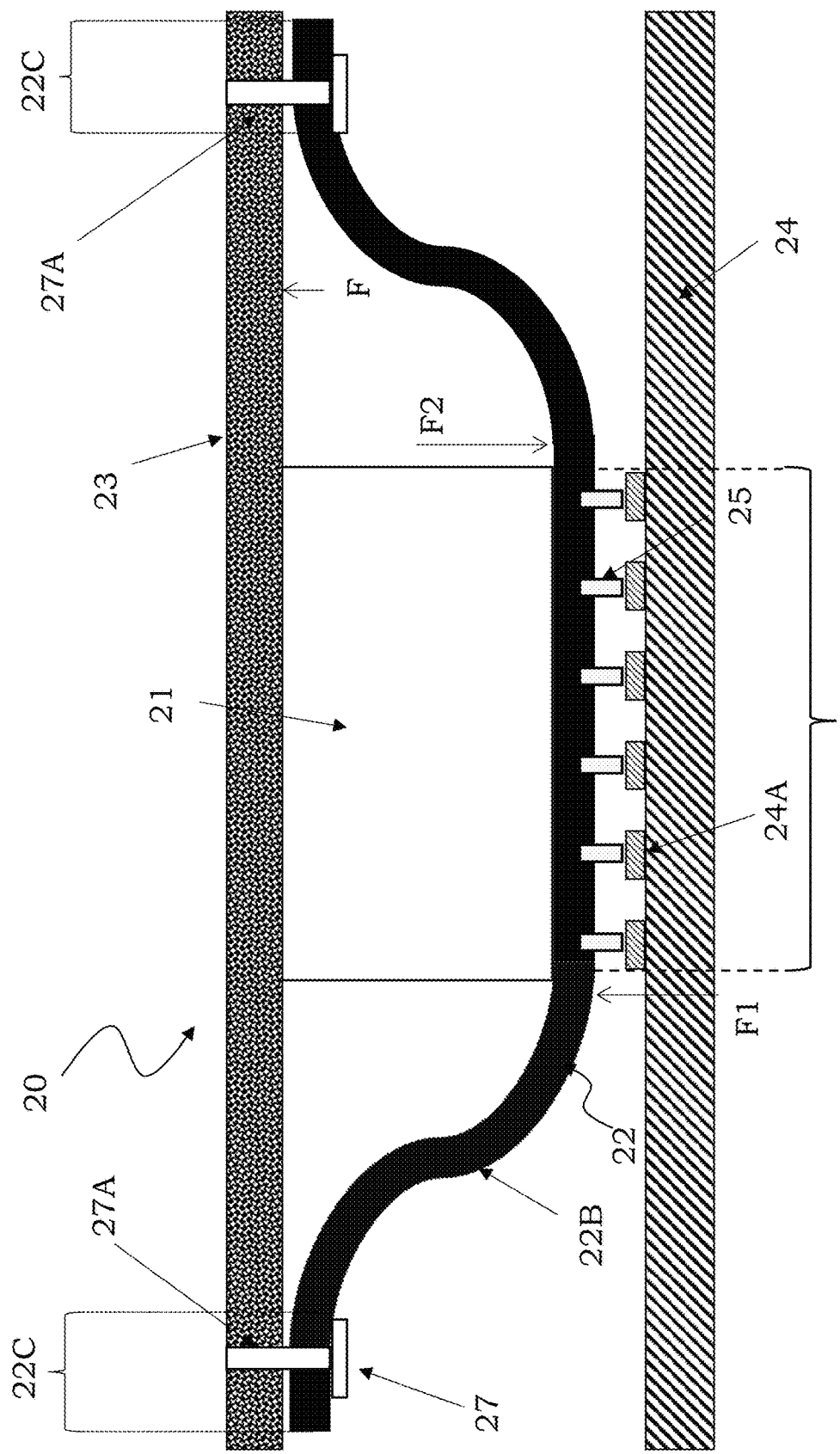
FIG. 2B schematically shows an alternative embodiment of a probe card equipped with a membrane for high frequency applications realized according to the prior art.
Figure 3A:
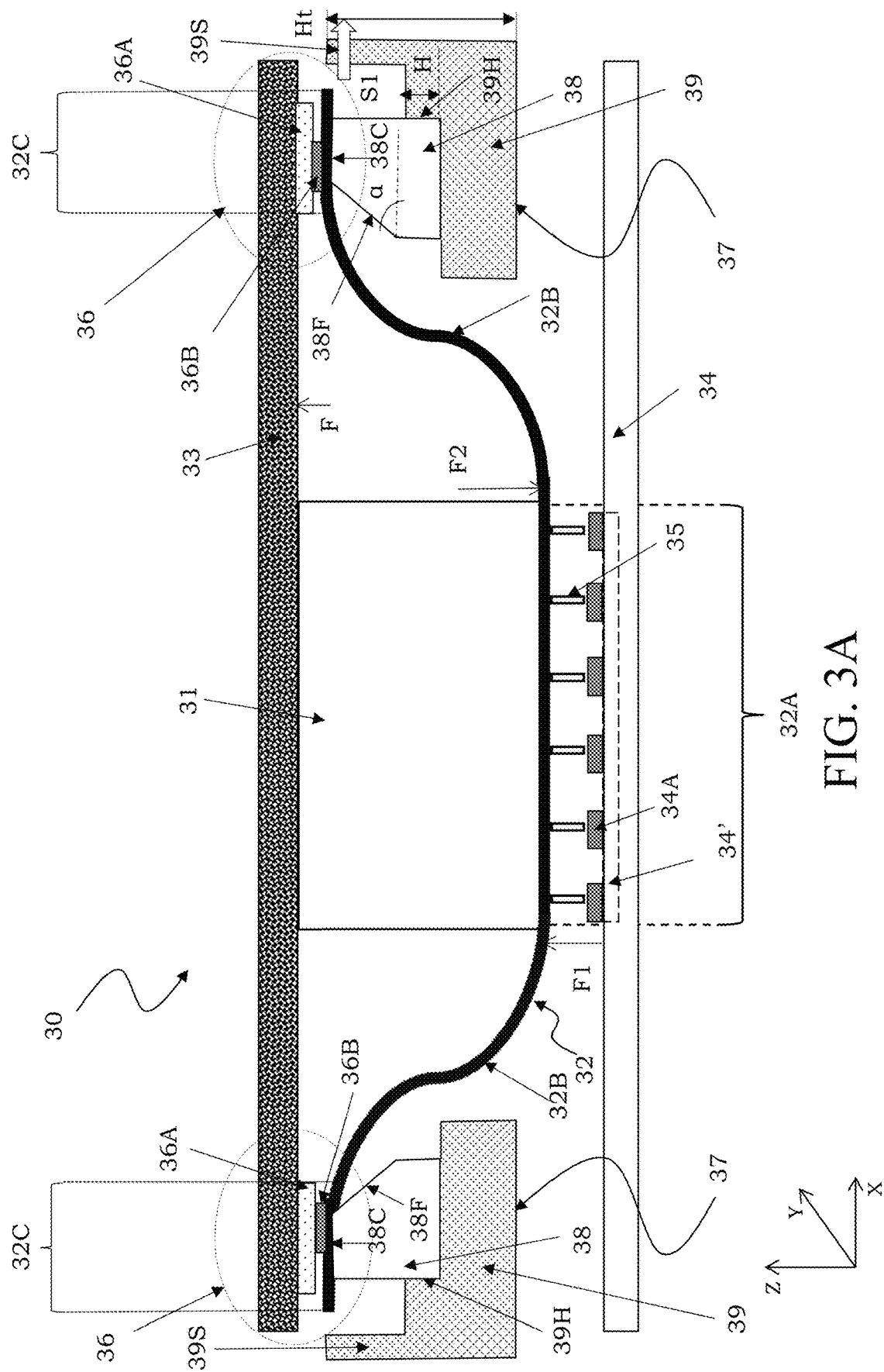
FIG. 3A schematically shows a probe card equipped with a membrane for high frequency applications realized according to the present disclosure.
Figure 3B:
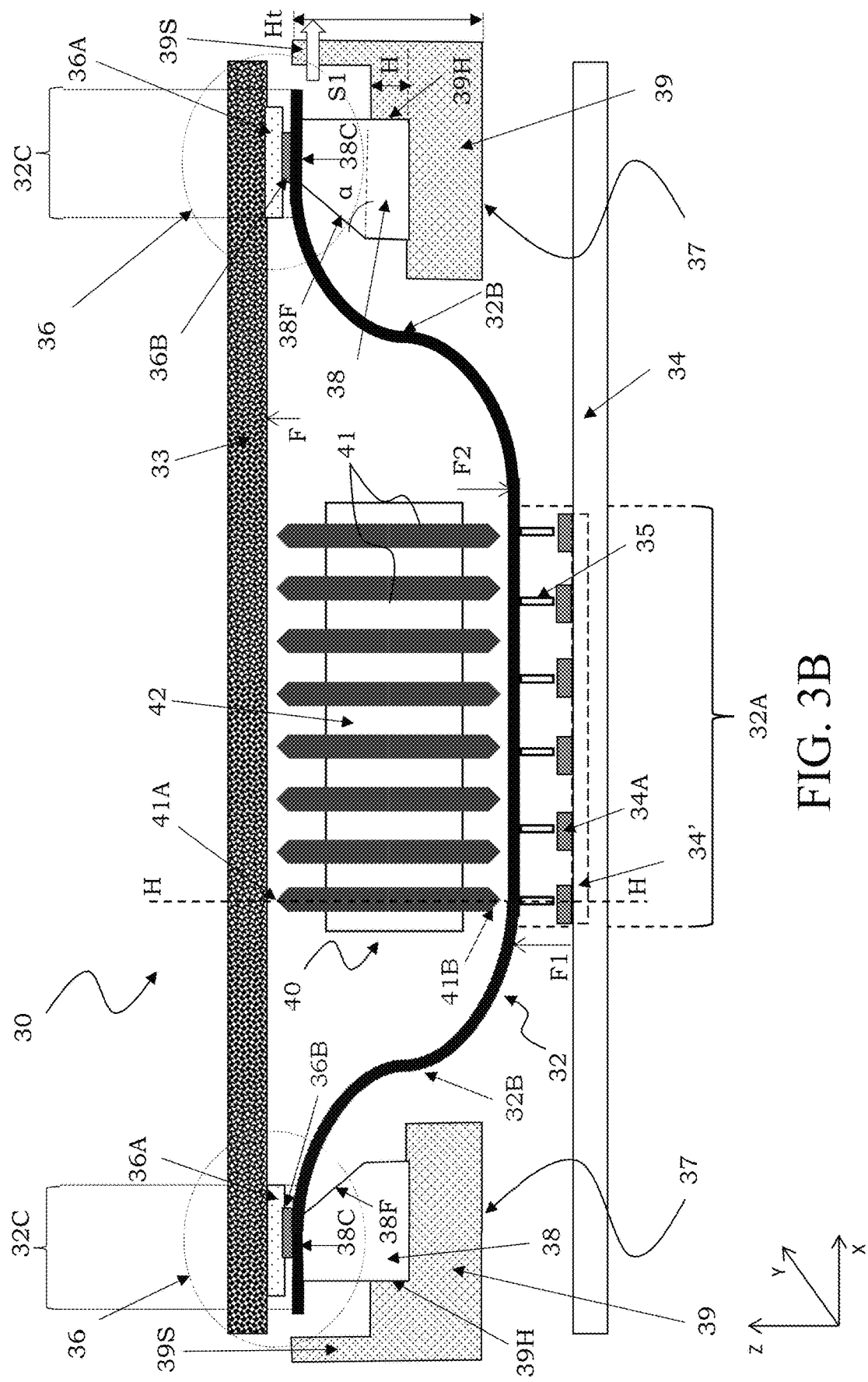
FIG. 3B schematically shows an alternative embodiment of a probe card equipped with a membrane for high frequency applications realized according to the present disclosure.

With reference to the figures, and particularly to FIGS. 3A and 3B, a probe card realized according to the present disclosure is globally and schematically indicated with 30.

It should be noted that the figures are schematic views and are not drawn to scale, but they are instead drawn so as to emphasize the important features of the disclosure. Furthermore, in the figures, the different elements are schematically depicted, the shape thereof being changeable depending on the desired application. Moreover, it should be noted that in the figures identical reference numbers refer to identical elements in terms of shape or function. Finally, special arrangements described in relation to an embodiment shown in a figure can also be used for the other embodiments shown in the other figures.

In its most general form, the probe card 30 is configured to connect to an equipment (not shown in the figures) to perform the test of electronic devices integrated on a semiconductor wafer. More particularly, the probe card 30 is suited to high frequency applications, that is, to carry signals with frequencies of more than 1 GHz.

In particular, the probe card 30 comprises at least one damping structure 31 interposed between a flexible membrane 32 and a support plate 33, which is in some embodiments a printed circuit board (PCB) which ensures the connection between this probe card 30 and the testing apparatus (not shown).

The probe card 30 is configured to abut onto a semiconductor wafer 34 comprising at least one device under test 34' equipped with a plurality of contact pads 34A.

Suitably, the flexible membrane 32 comprises a first portion or central portion 32A, a second portion or intermediate portion 32B and a third portion or peripheral portion 32C which are adjacent to each other. More particularly, as explained above in relation to the prior art, the central portion 32A is intended to contact the damping structure 31 and it is formed at least one device under test 34' of this semiconductor wafer 34 and thus at the corresponding contact pads 34A and the peripheral portion 32C is intended to contact the support plate 33, while the intermediate portion 32B is a portion intended to deform, in particular to lengthen and shorten, following the movement of the device under test 34' integrated on the semiconductor wafer 34 in contact with the central portion 32A during the testing operation thereof.

The probe card 30 further comprises a plurality of contact probes 35 arranged on a first face F1 of the flexible membrane 32, formed in particular at the central portion 32A thereof, this first face F1 being a lower face of the flexible membrane 32 according to the local reference of FIG. 3A, that is a face facing the semiconductor wafer 34 and thus the device under test 34' and the contact pads 34A thereof.

The contact probes 35 are in particular configured to mechanically and electrically contact these contact pads 34A of the device under test 34' integrated on the semiconductor wafer 34 and they are made of a conductive material selected, for example, between platinum, rhodium, palladium, silver, copper or an alloy thereof, such as a platinum alloy.

The contact probes 35 can be T-shaped (or overturned mushroom-shaped), in which the stem of the T is connected to the flexible membrane 32 while the head of the T is configured to contact the contact pads 34A of the device under test 34'. Alternatively, the contact probes 35 can be shaped as conductive bumps, which can include in turn a projecting contact portion made of rhodium for contacting the contact pads 34A of the device under test 34'. It is evident that the above-explained examples should not be construed as limiting of the present disclosure, the contact probes 35 being configured to have any suitable shape for the connection to the contact pads 34A of the device under test 34' integrated on the semiconductor wafer 34, for example, they can be shaped as so-called pillars or overturned, possibly truncated, pyramids.

Suitably, the contact probes 35 have a reduced height, in particular a height of less than at least 200 µm, comprised in general between 10 µm and 200 µm, height meaning a dimension of these contact probes 35 measured in a direction which is orthogonal to the device under test 34' and thus to the semiconductor wafer 34, that is along the axis Z of the local reference system indicated in the figure. Thereby, the contact probes 35 of the probe card 30 of the present disclosure are suited to test high frequency devices, the height thereof being such as to avoid disadvantageous self-inductance phenomena.

Furthermore, the damping structure 31 abuts onto a second face F2 of the flexible membrane 32, opposed to the first face F1, and it is positioned at the central portion 32A of this flexible membrane 32 so as to form an abutting element for the flexible membrane 32 in this central portion 32A whereat the contact with the contact probes 35 occurs and it allows a retention thereof in the direction of the axis Z during the pressing contact of these contact probes 35 onto the contact pads 34A of the device under test 34'

As above, this damping structure 31 thus acts as a damper for the contact probes 35, regulating the contact force thereof on the contact pads 34A and in particular it can be made of materials configured to maximize the damping effect for these contact probes 35 while ensuring a flatness of the central portion 32A of the membrane 32 during the contact with the device under test 34' integrated on the semiconductor wafer 34, that is during the testing operations performed by the probe card 30.

The flexible membrane 32 further comprises suitable conductive tracks configured to carry signals from the contact probes 35 towards the support plate 33. The conductive tracks can be formed on a surface of the flexible membrane 32, in particular on the second face F2 or upper face thereof according to the local reference of the figure or inside the flexible membrane 32 itself and they extend from the central portion 32A of the flexible membrane 32, in contact with a corresponding contact probe 35, along the intermediate portion 32B of this flexible membrane 32 up to reach the peripheral portion thereof 32C. It is also possible to form the metal tracks on the first face F1 of the flexible membrane 32 and to form suitable electrical contact structures, such as metallized through holes or conductive vias between the first and second face F1, F2 of the flexible membrane 32, for the contact of the tracks with the support plate 33.

Suitably, a ground metallization or ground is positioned on the face where the conductive tracks are not formed so as to establish a transmission of the coaxial type of the high frequency signals.

Advantageously according to the present disclosure and as schematically shown in FIG. 3A, the probe card 30 also comprises a sliding contact area 36 formed between the flexible membrane 32 and the support plate 33, in particular at the peripheral portion 32C of the flexible membrane 32 where the contact with the support plate 33 occurs. More particularly, the sliding contact area 36 comprises a plurality of first contact pads 36A formed on the support plate 33, formed in particular on a face F thereof facing the flexible membrane 32, the lower face thereof in the local reference of the figure, and a plurality of second contact pads 36B formed on the flexible membrane 32 and in contact with conductive tracks thereof, formed in particular on the second face F2 thereof facing the support plate 33, that is the upper face thereof in the local reference of the figure, these first and second contact pads 36A and 36B being thus facing and configured to come in pressing contact with each other when the flexible membrane 32, in particular the peripheral portion thereof 32C, is in pressing contact onto the support plate 33. Suitably, these first contact pads 36A and second contact pads 36B can be positioned so as to face each other in corresponding pairs.

More particularly, as shown in the example of FIG. 3A, the probe card 30 also comprises a pressing element 37 in pressing contact onto the peripheral portion 32C of the flexible membrane 32, in particular on the first face F1 thereof, at the sliding contact area 36 and configured to put in pressing contact the first and second contact pads 36A, 36B of this sliding contact area 36.

Thereby, advantageously according to the present disclosure, the sliding contact area 36 provides the electrical contact between the flexible membrane 32 and the support plate 33, in particular between the first contact pads 36A of the flexible membrane 32, connected in turn to the conductive tracks thereof, and the second contact pads 36B of the support plate 23, while the pressing element 37 ensures the mechanical contact between these contact pads 36A, 36B.

Suitably according to the present disclosure, the pressing element 37 comprises at least one flexible head 38, formed in particular at the peripheral portion 32C of the flexible membrane 32 and in contact at the sliding contact area 36 of the probe card 30. Furthermore, this pressing element 37 comprises a supporting body 39, associated with the flexible head 38, equipped with suitable tightening elements for the association thereof with the flexible membrane 32, as it will be shown in greater detail below.

More particularly, the flexible head 38 is configured to squeeze along a direction which is orthogonal to a reference plane 7C, substantially corresponding to a plane of the semiconductor wafer 34 comprising at least one device under test 34' and of the support plate 33, which are usually parallel to each other, in particular according to the axis Z of the local reference of the figure.

Suitably, the flexible head 38 comprises at least one inclined face 38F configured to arrange along the intermediate portion 32B of the flexible membrane 32 and a contact face 38C configured to abut onto the peripheral portion 32C of the flexible membrane 32 at the second contact pads 36B formed thereon. Thereby the flexible head 38, in particular the contact face 38C thereof, abuts in fact onto the flexible membrane 32 just at these second contact pads 36B, which form a mechanical support thereof. The squeezing of the flexible head 38, due to the presence of the inclined face 38F thereof, applies to the flexible membrane 32 a tension along a longitudinal direction thereof, indicated in the figure as S1, causing a stretching of the flexible membrane 32 in this direction S1.

Furthermore, the supporting body 39 advantageously comprises a step 39H formed in contact with the flexible head 38 in an opposite position with respect to the inclined face 38F thereof so as to form a housing seat for the flexible head 38. Suitably, the supporting body 39 also comprises at least one projection 39S which protrudes from the supporting body towards the support plate 33 and it is configured to abut onto it under tightening conditions of the pressing element 37, that is when the flexible head 28 is squeezed, so as to ensure a preset maximum value of the approaching of the pressing element 37 to the support plate 33 and thus to the flexible membrane 32, due to the maximum height Ht of the supporting body 39 at the projection 39S.

The flexible head 38 can be made of a silicon rubber or of an elastomer, while the supporting body 39 can be made of steel or other metal or ceramic material. Furthermore, the step 39H of the supporting body 39 can have a height H ranging from 200 to 400 µm.

According to an alternative embodiment shown in FIG. 3B, the probe card 30 comprises, as a damping structure 31, a probe head 40, which houses a plurality of contact elements 41, eight of these contact elements 41 being shown in FIG. 3B only by way of example.

In general, the probe head 40 comprises a main body 42 intended to house the contact elements 41, this main body 42 thus forming the supporting and retaining structure of these contact elements 41.

More particularly, the contact elements 41 comprise a substantially rod-shaped body extending along a longitudinal axis H-H between a first end portion 41A and a second end portion 41B, the first end portion 41A being configured to abut onto the support plate 43 and the second end portion 41B being configured to abut onto the second face F2 or upper face of the flexible membrane 32.

While the distribution of the contact probes 35 must match in number and position that of the contact pads 34A of the device under test 34' integrated on the semiconductor wafer 34, the distribution and the number of the contact elements 41 of the probe head 40 can be different, selected in particular so as to meet other requirements such as forming an adequate support for the central portion 32A of the flexible membrane 32 and preventing local or overall movements of this central portion 32A.

According to an alternative embodiment which is not shown, each contact element 41 abuts onto the second face F2 of the flexible membrane 32 at a contact probe 35 formed on the first face F1 of this flexible membrane 32, in a one-to-one correspondence, such that each contact element 41 acts as a damping element for a corresponding contact probe 35, regulating the contact force thereof on the contact pads 34A of the device under test integrated on the semiconductor wafer 34.

The main body 42 of the probe head 40 can also comprise an upper plate or guide and a lower plate or guide, having respective guide holes wherein the contact elements 41 are slidingly housed; the upper guide and the lower guide can be separated from each other by an air gap so as to allow the deformation of the contact elements 41 during the contact thereof with the support plate 33 and with the flexible membrane 32.

The contact elements 41 of the probe head 40 can have in particular a length comprised between 1.5 mm and 10 mm, that is a length that is much higher than the height of the corresponding contact probes 35 which, as seen above, is of less than 200 µm, having thus a much higher bending capacity. Suitably, these contact elements 41 can be also made of materials configured to maximize the damping effect for the corresponding contact probes 35.

Furthermore, it is pointed out that each contact element 41 moves independently from adjacent ones, so that each contact probe 35 can likewise move independently from adjacent ones during the contact with the contact pads 34A of the device under test 34'.

Suitably, the contact elements 41 are electrically insulated from the contact probes 35, in particular due to the flexible membrane 32 interposed therebetween.

Furthermore, the flexible membrane 32 can in turn comprise a plurality of abutting structures in the form of contact pads, formed on the second face F2 thereof, onto which the second end portion 41B of the contact elements 41 is configured to abut. The abutting structures are particularly configured to deaden the abutment of the second end portion 41B of the contact elements 41 on the flexible membrane 32, acting in essence as a protective structure of the membrane itself.

Suitably, the contact probes 35 are electrically connected to conductive tracks formed in the flexible membrane 32, directly or by interposition of an element such as a film of conductive glue.

Thereby, the conductive tracks, which are flexible as well, can be used to perform the desired redirection of the signals from the contact probes 35 towards the sliding contact area 36, in particular towards the second contact pads 36B formed on the flexible membrane 32 and thus towards the first contact pads 36A formed on the support plate 33 when in pressing abutment onto the flexible membrane 32.

The conductive tracks can extend at one of the faces of the flexible membrane 32, preferably the first or the second face F1, F2 thereof or inside the membrane itself, that is, they can be embedded therein, combinations of these configurations being possible for the conductive tracks, even on different levels. In particular, the number of levels of the flexible membrane 32 in which the conductive tracks are formed can vary depending on the requirements and/or circumstances, for example, depending on the number of the signals to be carried and thus depending on the complexity of the redirection pattern to be formed on this flexible membrane 32. For example, it is possible to provide a configuration in which a first level comprises tracks configured to carry the power supply signal and a second level comprises tracks configured to carry the ground signal.

In particular, the conductive tracks of the flexible membrane 32 put the contact probes 35 in contact with the contact pads 36B; they are thus formed on the first face F1 of the flexible membrane 32 at the contact probes 35, that is at the central portion 32A of the flexible membrane 32 and on the second face F2 of the flexible membrane 32 at the second contact pads 36B, that is at the peripheral portion 32C of the flexible membrane 32. In particular, the flexible membrane 32 can comprise suitable openings or vias to allow the passage of the conductive tracks thereof from one face to the other. Alternatively, the conductive tracks can be formed embedded in the flexible membrane 32 and let emerge in its central portion 32A on the second face F2 thereof and at its peripheral portion 32C on the first face F1 thereof.

The flexible membrane 32 is made of dielectric materials, in some embodiments polyamide, configured to provide the desired flexibility and the desired electrical insulation, while the conductive tracks are in some embodiments made of copper. Moreover, the flexible membrane 32 can have a thickness comprised between 10 and 100 µm, and in some embodiments the thickness is substantially equal to or equal to 50 µm.

Alternatively, in an embodiment which is not shown, one or more of the contact elements 41 can be used to carry signals between the device under test and the testing apparatus. In this case, the contact element 41 is electrically connected to a corresponding contact probe 35 by conductive electrical contact elements formed in the flexible membrane 32 at the central portion 32A thereof, these conductive electrical contact elements extending between the first face F1 and the second face F2 of the flexible membrane 22 so as to connect these opposed faces F1 and F2 to each other. In particular, the conductive electrical contact elements can be formed, for example, by filling with a conductive material suitable through holes or paths formed in this flexible membrane 32 that are orthogonal to the faces F1 and F2.

Thereby, the contact element being referred to performs a double function, acting on the one hand as a damping element of the contact probes 35 and, on the other hand, carrying signals towards the support plate 33.

In this embodiment, the support plate 33 comprises further conductive contact pads (not shown in the figures) at the first end portion 41A of the contact elements 41 with a double function, against which these end portions abut to actually carry the signals towards the testing apparatus, particularly signals not requiring to be carried by short probes, that is signals not having a high frequency, thereby simplifying also the descrambling of the signals by the flexible membrane 32, limited to the high frequency signals carried by the contact probes 35.

It is pointed out that, advantageously according to the present disclosure, the pressing element 37 is thus configured to apply a tensive force to the flexible membrane 32 which causes a deformation thereof along the direction S1 indicated in the figures. Suitably, the tension of the flexible membrane 32 also causes a local sliding of the contact pads 36A, 36B of the sliding contact area 36, obtaining the surface cleaning thereof by way of a scrub with the removal of possible surface oxides, which improves the electrical contact between these pads.

More particularly, this mechanism is obtained due to a suitable configuration of the flexible head 38 which is so shaped as to have at least the face 38F which is inclined with respect to the reference plane π, substantially corresponding to a plane of the semiconductor wafer 34 comprising at least one device under test and of the support plate 33, usually parallel to each other. The inclined face 38F of the flexible head 38 can form in particular an angle α with this reference plane π, that is, with the axis X of the local reference of the figures, with values comprised between 15° and 75°, and in some embodiments 45°. Furthermore, this inclined face 38F is arranged substantially parallel to the intermediate portion 32B of the flexible membrane 32.

The flexible head 38 equipped with the inclined face 38F is thus configured to stretch the flexible membrane 32 in a longitudinal direction, in particular in the direction S1 indicated in the figures, suitably outwards of the probe card 30, that is in an opposite direction with respect to the area where the damping structure 31 is positioned.

Figures 4A, 4B:
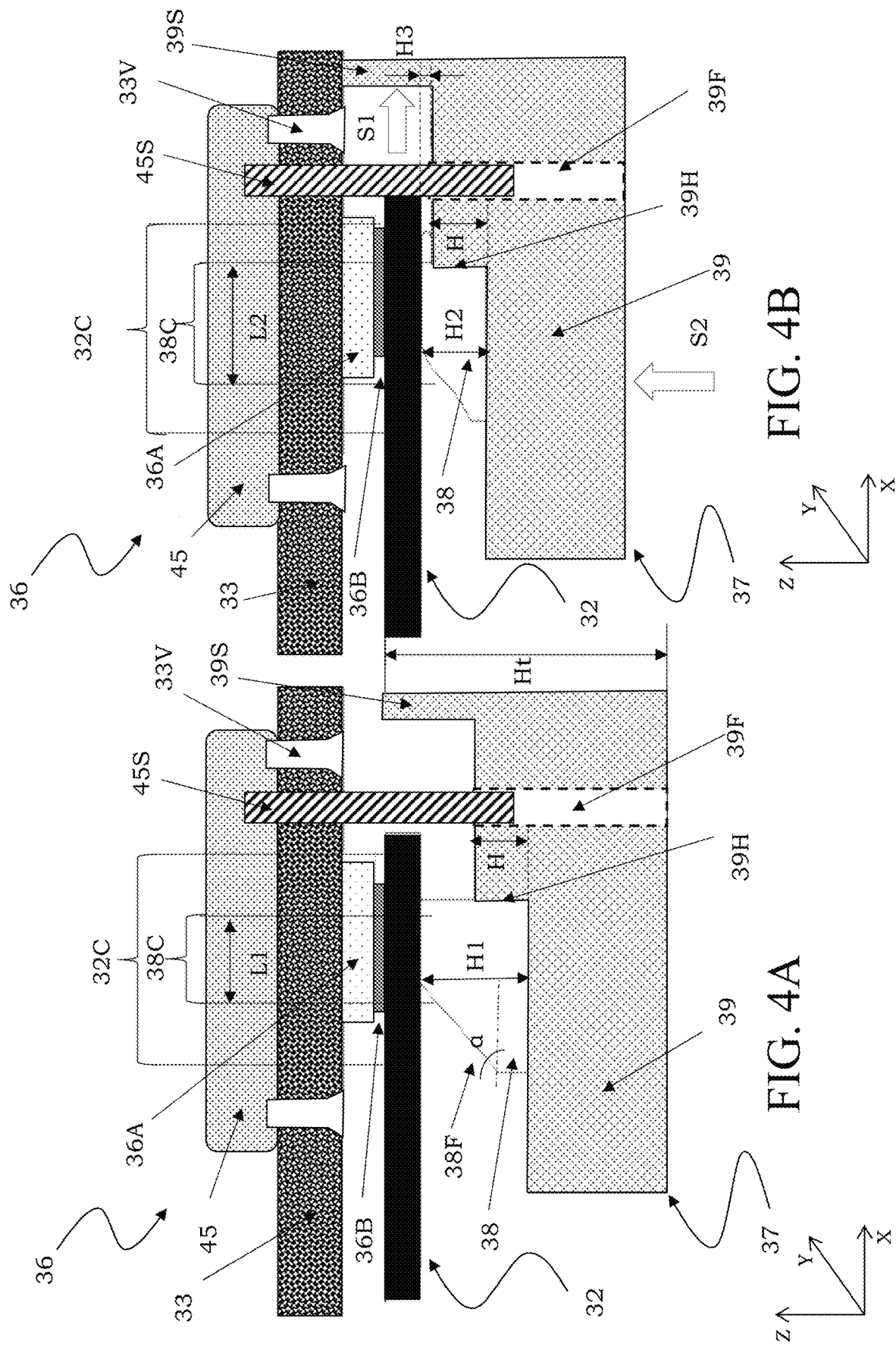
FIGS. 4A and 4B shown on an enlarged scale a detail of the probe cards of FIGS. 3A and 3B in different working conditions thereof.

More particularly, as schematically shown in FIGS. 4A and 4B, during the tightening of the pressing element 37 at the sliding contact area 36, which causes the pressing contact of the flexible membrane 32, at the peripheral portion thereof 32C, on the support plate 33 and thus of the first contact pads 36A formed on the support plate 33 onto the second contact pads 36B formed on the flexible membrane 32, the flexible head 38 thereof squeezes, passing from a first height H1, indicated in FIG. 4A, to a second and lower height H2, indicated in FIG. 4B. In particular this first height H1 has values comprised between 1 and 2 mm, and in some embodiments substantially equal to or equal to 1.5 mm and said second height H2 has values comprised between 0.8 and 1.2 mm, and in some embodiments substantially equal to or equal to 1 mm.

The squeezing of the flexible head 38 of the pressing element 37 is caused by the tightening of its supporting body 39 and thus by the movement thereof along the direction S2, as indicated in FIG. 4B.

This squeezing also causes a lengthening of the contact face 38C of the flexible head 38 which passes from a first length L1 to a second length L2, however remaining at the second contact pads 36B formed on the peripheral portion 32C of the flexible membrane 32, which thus act as a mechanical support of the squeezed flexible head 38, as shown in FIG. 4B.

Suitably, the contact face 38C of the flexible head 38 in the squeezed condition thereof abuts against the supporting body 39 due to the step 39H, keeping a separation area having a height H3 between the supporting body 39 and the flexible membrane 32 avoiding any possible damage of the membrane itself. In particular this height H3 has values comprised between 100 and 400 μm, and in some embodiments substantially equal to or equal to 250 μm.

Suitably, the pressing element 37 is thus associated with a guide 45 associated with the support plate 33 by suitable tightening screws 33V, as indicated in FIGS. 4A and 4B, acting as a counter-pressor of the tightening body 39 of the pressing element 37. Furthermore, a tightening pin 45S is arranged between the guide 45 and the supporting body 39 of the pressing element 37, this supporting body 39 being equipped with suitable housing holes 39F for this tightening pin 45S. The tightening of the pressing element 37 against the guide 45 involves the insertion of the tightening pin 45S into the housing hole 39F and the correct retention of the pressing element 37 with the flexible head 38 under squeezed conditions.

It should be pointed out that the presence of holes formed in the flexible membrane 32 to connect the faces F1 and F2 thereof, and thus to allow the conductive tracks to contact the contact probes 35 on the first face F1 and the second contact pads 36B on the second face F2 unfortunately leads to losses and troubles in the transmission of high frequency signals.

According to an advantageous alternative embodiment schematically shown in FIG. 6A, the probe card 30 can comprise a support plate 33 suitably equipped with openings 33S allowing the passage of the flexible membrane 32 and also allowing the second contact pads 36B to be formed in the peripheral portion 32C of the flexible membrane 32 at the first face F1. Thereby, the conductive tracks to connect the contact probes 35 and the second contact pads 36B can be all formed at this first face F1, allowing the flexible membrane 32 to be kept integral and improving the transmission of high frequency signals it performs.

In this case, the pressing element 37, formed similarly to the embodiments of FIGS. 3A and 3B, is positioned at a face which is opposed to the face F of the support plate 33, that is above the support plate 33 according to the local reference of the figure where the sliding contact area 36 formed between the flexible membrane 32 and the support plate 33 is positioned as well, still at the peripheral portion 32C of the flexible membrane 32.

Figure 5A:
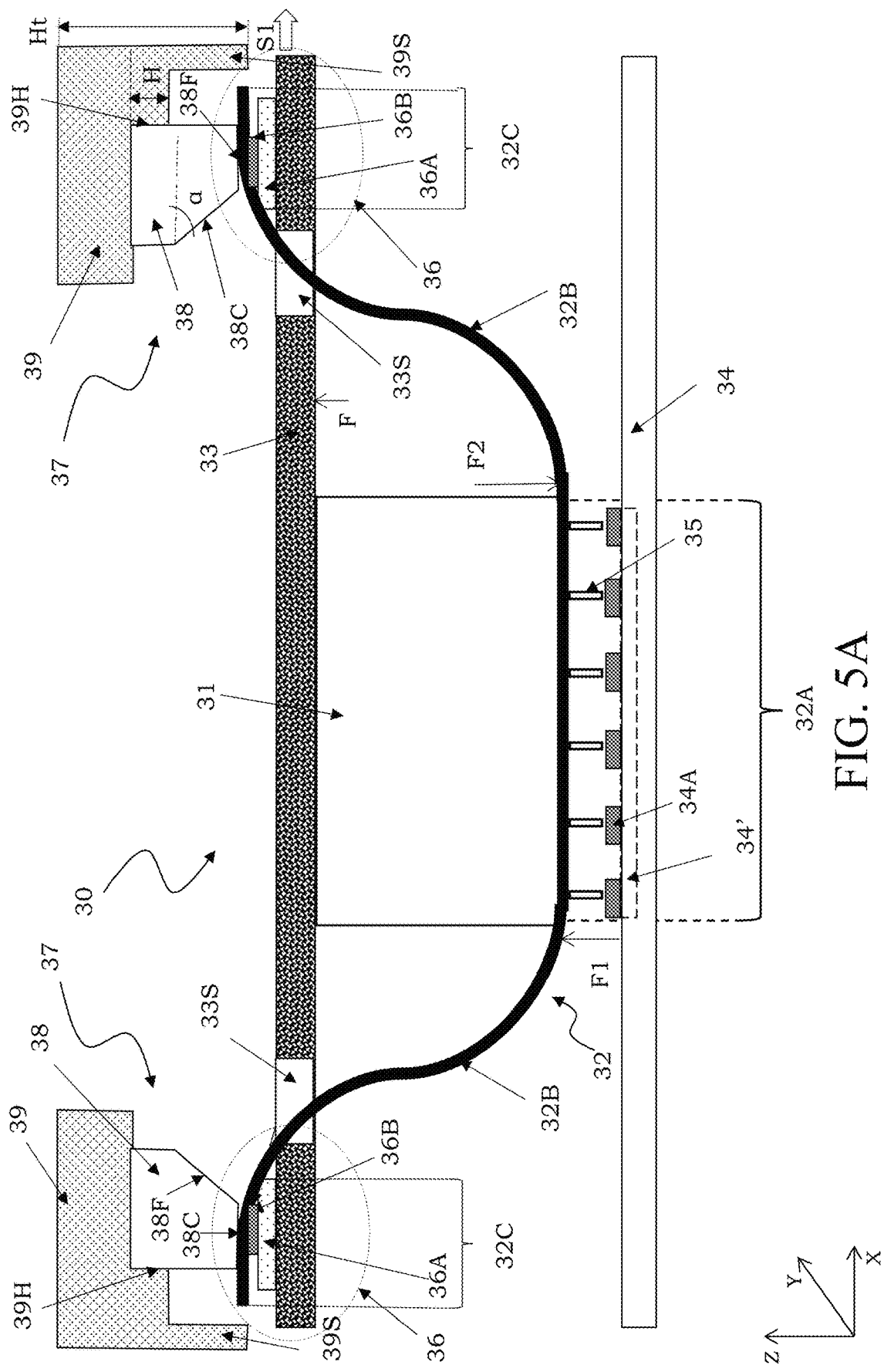
FIGS. 5A and 5B schematically show further alternatives of a probe card equipped with a membrane for high frequency applications realized according to the present disclosure.
Figure 5B:
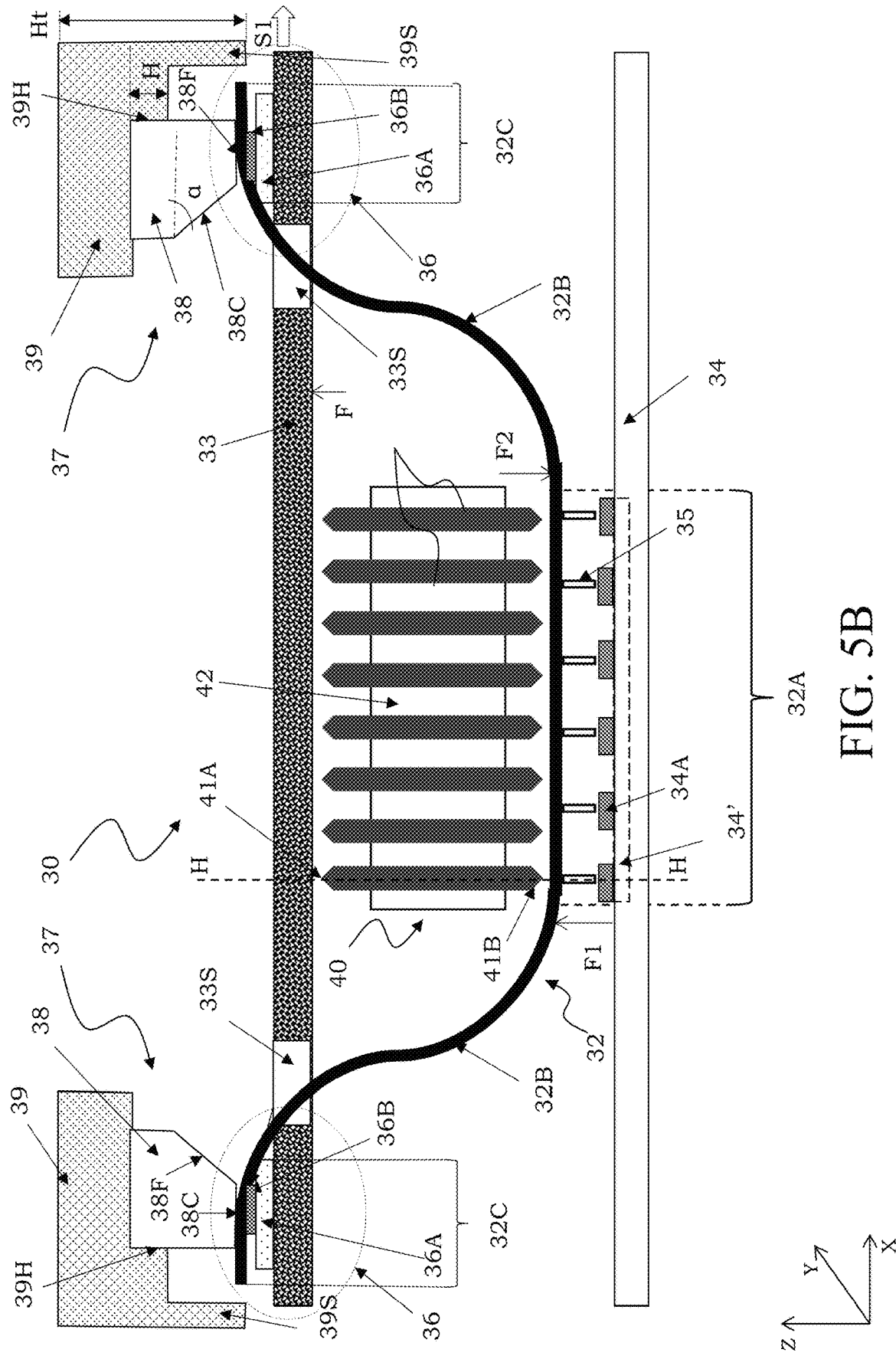

The probe card 30 can comprise a damping structure 31, as schematically shown in FIG. 5A or a probe head 40 which houses a plurality of contact elements 41 as shown in FIG. 5B, interposed between the support plate 33 and the flexible membrane 32 at a central portion 32A thereof.

As above, the pressing element comprises a flexible head 38 which is configured to squeeze along a direction which is orthogonal to the reference plane 7C corresponding to the plane of the semiconductor wafer 34 and of the support plate 33, thus applying to the flexible membrane 32 a tension along the longitudinal direction S1 thereof, causing a stretching of the flexible membrane 32 in this direction S1 and also causing a local sliding of the contact pads 36A, 36B of the sliding contact area 36.

More particularly, as schematically shown in FIGS. 6A and 6B, the positioning of the pressing element 37 at the sliding contact area 36 causes the pressing contact of the flexible membrane 32, at the peripheral portion 32C thereof, onto the support plate 33 and thus the mechanical contact of the first contact pads 36A formed onto the support plate 33 and of the second contact pads 36B formed onto the flexible membrane 32; furthermore, the tightening of this pressing element 37, that is the movement thereof along the direction S2, causes the squeezing of the flexible head 38 and thus the lengthening of the contact face 38C thereof and the sliding of the first and second contact pads 36A and 36B on each other, ensuring a friction and thus a cleaning thereof and thus the correct electrical contact.

As already indicated, the supporting body 39 comprises the projection 39S which is configured to abut onto the support plate 33 under tightening conditions of the pressing element 37, that is when the flexible head 28 is squeezed. Suitably the projection 39S is equipped with an opening 39S1 at conductive tracks formed on the support plate 33. The opening 39S1 has in some embodiments a height Hs1 of more than 400 µm, so as to avoid any possible interference with these conductive tracks even in case of RF applications. The projection 39S is thus substantially bridge-shaped, astride the conductive tracks of the support plate 33.

Figure 7:
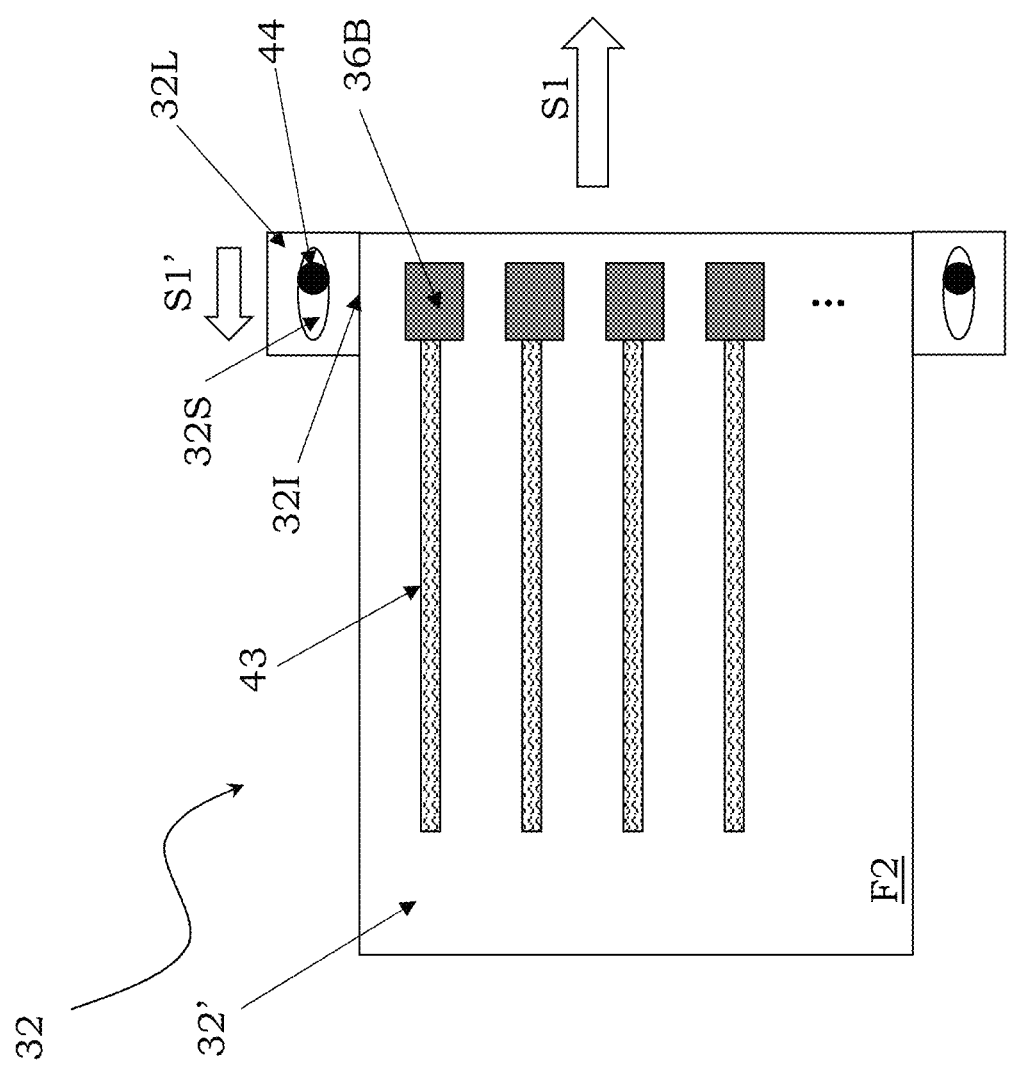
FIG. 7 schematically shows from above a membrane comprised in the probe cards of FIG. 3A, 3B or 5A, 5B.

According to an alternative embodiment schematically shown in FIG. 7, the flexible membrane 32 can also comprise at least one pair of wings 32L formed projecting from a body portion 32' thereof at the first contact pads 36A formed on this flexible membrane 32, in particular on the first face F1 thereof and connected to conductive tracks 43 extending along its longitudinal direction, as shown in the figure.

Suitably, the wings 32L comprise respective housing slots 32S of alignment pins 44 for the retention of the flexible membrane 32. Advantageously according to the present disclosure, the slots 32S have an elongated shape along the longitudinal direction S1 so as to allow a movement in this direction of the alignment pins 44 when the flexible membrane 32 is lengthened, the movement of the alignment pins 44 being in an opposite direction with respect to this lengthening, as indicated by the arrow S1' in FIG. 5. Thereby, the lengthening of the flexible membrane 32 does not cause troublesome creasing of the membrane 32 at the interfaces 321 thereof between the body portion 32' and the wings 32L and it thus allows the flexible membrane 32 itself to be repositioned several times, ensuring a long service life thereof without deformations at these interfaces 321 and without micro- or macro-breakings thereof at the slots 32S.

Figure 8:
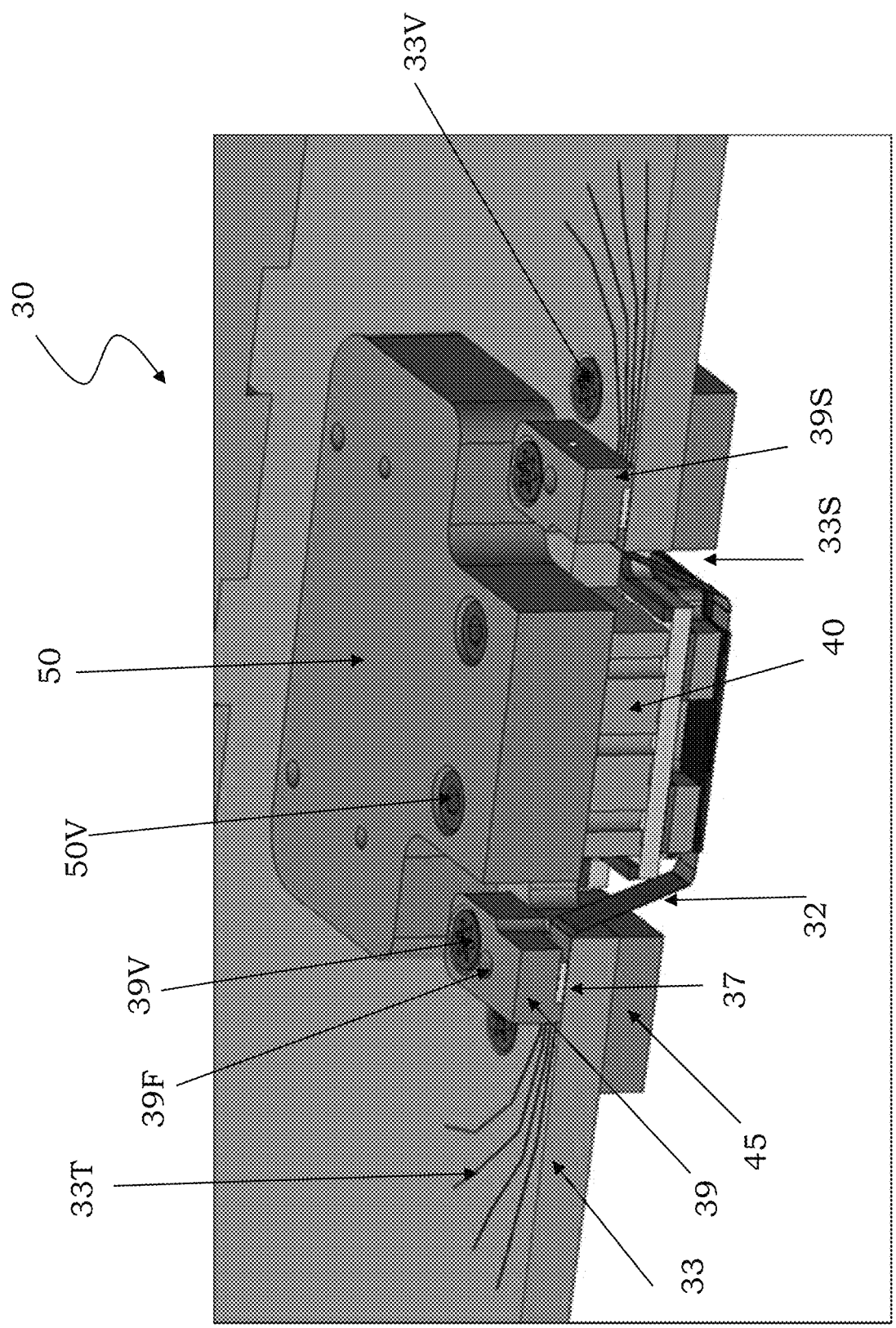
FIG. 8 schematically shows in axonometric projection from above a probe card of FIGS. 5A and 5B.

An axonometric view of a probe card 30 according to the embodiment of FIG. 5B is schematically shown in FIG. 8, the probe card 30 comprising a probe head 40 equipped with a plurality of contact elements (not shown in the figure), abutting against the flexible membrane 32.

It is possible to verify the presence of the openings 33A in the support plate 33 for the passage of the flexible membrane 32 as well as the presence of the pressing elements 37 equipped with the passage holes 39F of the alignment pins 45S besides suitable screws 39V for tightening the corresponding support bodies 39 to the support plate 33.

The probe card 30 further comprises the guide 45 acting as a counter-pressor associated with the support plate 33 through suitable tightening screws 33V and a further counter-pressor 50 abutting against the support plate 33 and equipped with suitable tightening screws 50V, this further counter-pressor 50 being configured to act as a stiffener or a CTE (Coefficient of Thermal Expansion) regulator.

The probe card 30 finally comprises a plurality of conductive tracks 33T formed on the support plate 33 from the areas contacting the flexible membrane 32 at the pressing elements 37. As seen above, the supporting body 39 of the pressing elements 37 comprises the projection 39S configured to abut onto the support plate 33 under tightening conditions and equipped with an opening 39S1 at these conductive tracks 33T formed on the support plate 33, so as to avoid any possible interference even in case of RF applications.

In conclusion, the present disclosure provides a probe card whose contact probes are shaped as very short contact tips connected to a face of a flexible membrane, so as to allow high frequency signals to be carried. Suitably the probe card comprises at least one sliding contact area including first and second contact pads, formed on the flexible membrane at a peripheral portion thereof and on the support plate respectively and configured to come in pressing contact onto each other to provide the desired electrical contact between these pads and corresponding conductive tracks connected thereto. Moreover, the probe card comprises at least one pressing element formed at this sliding contact area and configured to stretch the flexible membrane at the peripheral portion thereof.

Advantageously according to the present disclosure, the proposed probe card is particularly performing in radiofrequency applications, due to the reduced size of the contact tips comprised therein, having a height of less than 200 µm.

The presence of the sliding contact area equipped with the contact pads and with the pressing element allows a correct working of the probe card to be ensured during the testing operations of devices under test integrated on a semiconductor wafer, without introduction of noises in the carried signals and without any risk of micro- or macro-breakings of this flexible membrane.

Suitably, the probe card comprises a damping structure for the contact probes, remedying to the stiffness thereof, drastically reducing the possibility of breaking thereof and meanwhile ensuring an adequate reduction of the pressure they exert, warding off possible breakings of the contact pads of the devices under test against which the short probes abut.

The probe card of the present disclosure works thus correctly even in case of flatness problems of the elements composing it or of the wafer and of the devices under test comprised therein.

Furthermore, the possibility to adopt a hybrid configuration, in which some contact elements as well are configured to carry specific signals, considerably simplifies the descrambling of the signals by the flexible membrane, especially in the case of various signals to be carried through the probe card. For example, through these contact elements it is possible to carry power supply signals and/or ground signals, i.e., signals which do not require particularly short contact probes, while high frequency signals, which require short probes to avoid self-inductance problems, are only carried by the contact tips associated with the flexible membrane.

The configuration of the flexible head of the pressing element ensures the correct positioning thereof at the contact pads of the sliding contact area and the correct support thereof. Furthermore, the configuration of the supporting body of this pressing element ensures the correct abutment of the flexible head thereof under squeezing conditions, without any risk of damaging the flexible membrane.

This flexible membrane can also be retained by alignment pins housed in elongated slots so as to avoid local damages of the flexible membrane or of the slots themselves.

Moreover, the probe card can comprise a support plate equipped with openings for the passage of the flexible membrane so as to ensure the structural integrity thereof and reduce the losses in the transmissions of high frequency signals.

It is pointed out that the various advantages of the probe card of the present disclosure are achieved by exploiting the technology of the vertical probe heads, thus without overly complicating the manufacturing process thereof.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A probe card for testing a device under test having a plurality of contact pads comprising:
   at least one support plate having first contact pads formed thereon;
   a flexible membrane having a first face and a peripheral portion including second contact pads formed thereon;
   a plurality of contact probes being associated with the first face of the flexible membrane and being configured to abut onto the plurality of contact pads of the device under test and to carry high frequency signals; and
   at least one sliding contact area including:
      the first contact pads formed on the support plate;
      the second contact pads formed on the peripheral portion of the flexible membrane,
   the peripheral portion of the flexible membrane being configured to come in pressing contact onto the support plate at the sliding contact area,
      one pressing element in pressing contact on the peripheral portion of the flexible membrane at the sliding contact area,
   the pressing element putting in pressing contact the second contact pads onto the first contact pads and providing an electrical and mechanical contact between the flexible membrane and the support plate,
   wherein:
      the pressing element comprises at least one flexible head configured to abut onto the first face of the flexible membrane in correspondence of its peripheral portion and to squeeze under tightening conditions of the pressing element, the flexible head having at least one contact face arranged in correspondence of the first contact pads formed on the flexible membrane,
      the semiconductor wafer comprising the device under test lays on a reference plane,
      the flexible head is configured to squeeze in a direction which is orthogonal to the reference plane, and
      the flexible head has a shape which further comprises at least one inclined face with respect to the reference plane which stretches the flexible membrane in a longitudinal direction during the tightening.

2. The probe card of claim 1, wherein the pressing element further comprises a supporting body, associated with the flexible head and equipped with at least one step for an abutment of the flexible head under tightening conditions.

3. The probe card of claim 2, wherein:
   the support plate comprises conductive tracks formed thereon; and
   the supporting body further comprises at least one projection which is configured to abut onto the support plate under tightening conditions of the pressing element,
   the projection being equipped with an opening in correspondence of the conductive tracks.

4. The probe card of claim 1, further comprising:
   a guide fastened to the support plate;
   the pressing element being associated with the guide which acts as its counter-pressor.

5. The probe card of claim 4, further comprising:
   a supporting body associated with the flexible head; and
   a tightening pin arranged between the guide and the supporting body.

6. The probe card of claim 1, further comprising alignment pins configured to retain the flexible membrane, and wherein the flexible membrane further comprises:
   a body portion; and
   at least one pair of wings projecting from the body portion in correspondence of the first contact pads and comprising respective housing slots of the alignment pins,
   the housing slots having an elongated shape along the longitudinal direction so as to allow a movement of the alignment pins in an opposite direction with respect to the longitudinal direction.

7. The probe card of claim 1, wherein the flexible membrane is made of dielectric materials.

8. The probe card of claim 1, wherein the support plate is a printed circuit board configured to connect to the testing apparatus.

9. The probe card of claim 1, wherein the flexible membrane comprises:
   the central portion, the peripheral portion and an intermediate portion; and
   conductive tracks extending from the central portion towards the peripheral portion along the intermediate portion,
   the conductive tracks connecting the contact probes to the contact pads of the sliding contact area.

10. The probe card of claim 9, wherein:
    the flexible membrane has a second face opposite the first face; and
    the conductive tracks are formed at the first face or at the second face or are embedded in the flexible membrane at one or more levels.

11. The probe card of claim 10, wherein the flexible membrane further comprises conductive vias for connection between the first and second faces configure to allow the passage of the conductive tracks.

12. A probe card for a testing apparatus of electronic devices, comprising:
    at least one support plate having first contact pads formed thereon;
    a flexible membrane having a first face and including a central portion and a peripheral portion, the peripheral portion including second contact pads formed thereon;
    a plurality of contact probes being in contact with the first face in correspondence of the central portion of the flexible membrane, the contact probed being configured to abut onto a plurality of contact pads of a device under test and to carry high frequency signals; and at least one contact area wherein the first contact pads formed on the support plate contact the second contact pads formed on the flexible membrane in correspondence of its peripheral portion, wherein the flexible membrane is configured to come in pressing contact onto the support plate in correspondence of the contact area; and the probe card further comprises at least one pressing element in pressing contact on the peripheral portion of the flexible membrane in correspondence of the contact area putting in pressing contact the second contact pads onto the first contact pads and providing an electrical and mechanical contact between the flexible membrane and the support plate, said pressing element comprising:

at least one flexible head configured to abut onto the peripheral portion of the flexible membrane in correspondence of its first face and to squeeze under tightening conditions of the pressing element, the flexible head having at least one contact face arranged in correspondence of the first contact pads formed on the flexible membrane in a direction which is orthogonal to a reference plane, being a plane of a semiconductor wafer comprising the device under test and being shaped so as to further comprise at least one inclined face with respect to the reference plane so as to stretch the flexible membrane in a first direction during the tightening and to cause a local sliding of the first contact pads and second contact pads of the contact area on each other.

13. The probe card of claim 12, wherein the pressing element further comprises a supporting body, associated with the flexible head and equipped with at least one step for an abutment of the flexible head under tightening conditions.

14. The probe card of claim 13, wherein:

the support plate comprises conductive tracks formed thereon; and the supporting body further comprises at least one projection which is configured to abut onto the support plate under tightening conditions of the pressing element, the projection being equipped with an opening in correspondence of the conductive tracks.

15. The probe card of claim 12, wherein the inclined face of the flexible head forms with the reference plane an angle with a value within a range between 15° and 75°.

16. The probe card of claim 15, wherein the inclined face of the flexible head forms with the reference plane an angle with a value of 45°.

17. The probe card of claim 12, wherein the flexible head is made of a silicon rubber or of an elastomer.

18. The probe card of claim 12, further comprising:

a guide fastened to the support plate;

the pressing element being associated with the guide which acts as its counter-pressor.

19. The probe card of claim 18, further comprising:

a supporting body associated with the flexible head; and a tightening pin arranged between the guide and the supporting body.

20. The probe card of claim 12, further comprising alignment pins configured to retain the flexible membrane, and wherein the flexible membrane further comprises:

a body portion; and at least one pair of wings formed projecting from the body portion in correspondence of the first contact pads and comprising respective housing slots of the alignment pins, the housing slots having an elongated shape along the longitudinal direction so as to allow a movement of the alignment pins in an opposite direction with respect to the longitudinal direction.

21. The probe card of claim 12, wherein the flexible membrane is made of dielectric materials.

22. The probe card of claim 21, wherein the flexible membrane is made of polyamide.

23. The probe card of claim 12, wherein the flexible membrane has a thickness within a range between 10 and 100 μm.

24. The probe card of claim 12, wherein the contact probes have a height of less than 200 μm.

25. The probe card of claim 12, wherein the support plate is a printed circuit board configured to connect to the testing apparatus.

26. The probe card of claim 12, wherein the flexible membrane comprises:

the central portion, the peripheral portion and an intermediate portion; and conductive tracks extending from the central portion towards the peripheral portion along the intermediate portion, the conductive tracks connecting the contact probes to the contact pads of the sliding contact area.

27. The probe card of claim 26, wherein:

the flexible membrane has a second face opposite the first face; and the conductive tracks are formed at the first face or at the second face or are embedded in the flexible membrane at one or more levels.

28. The probe card of claim 27, wherein the flexible membrane further comprises conductive vias for connection between the first and second faces configure to allow the passage of the conductive tracks.

29. The probe card of claim 12, wherein the support plate is equipped with openings for the passage of the flexible membrane.

30. The probe card according to claim 12, wherein the contact probes are T-shaped.

* * * * *